(12) United States Patent
Chang

(10) Patent No.: US 9,768,741 B2
(45) Date of Patent: Sep. 19, 2017

(54) METHOD FOR IMPROVING CIRCUIT STABILITY

(71) Applicant: AIROHA TECHNOLOGY CORP., Hsinchu (TW)

(72) Inventor: Chun-Hsiung Chang, Hsinchu (TW)

(73) Assignee: Airoha Technology Corp., Hsinchu (TW)

( * ) Notice: Subject to any disclaimer, the term of this patent is extended or adjusted under 35 U.S.C. 154(b) by 0 days.

(21) Appl. No.: 14/989,911

(22) Filed: Jan. 7, 2016

(65) Prior Publication Data

US 2016/0344347 A1    Nov. 24, 2016

Related U.S. Application Data

(60) Provisional application No. 62/164,840, filed on May 21, 2015.

(51) Int. Cl.
| | |
|---|---|
| *H03F 1/02* | (2006.01) |
| *H03F 1/56* | (2006.01) |
| *H03F 3/21* | (2006.01) |
| *H03F 1/32* | (2006.01) |
| *H03F 3/19* | (2006.01) |
| *H03F 1/14* | (2006.01) |

(52) U.S. Cl.
CPC .............. *H03F 1/565* (2013.01); *H03F 1/14* (2013.01); *H03F 3/19* (2013.01); *H03F 3/21* (2013.01); *H03F 2200/318* (2013.01); *H03F 2200/451* (2013.01); *H03F 2203/21139* (2013.01)

(58) Field of Classification Search
USPC .................................. 330/302, 310, 133, 150
See application file for complete search history.

(56) References Cited

U.S. PATENT DOCUMENTS 7,928,802 B2 *    4/2011    Ohnishi ................ H03F 1/0272
                                                                  330/286

FOREIGN PATENT DOCUMENTS

| | | |
|---|---|---|
| CN | 1515071 A | 7/2004 |
| TW | 200520409 | 6/2005 |

* cited by examiner

*Primary Examiner* — Hieu Nguyen
(74) *Attorney, Agent, or Firm* — Rosenberg, Klein & Lee

(57) ABSTRACT

A method for improving circuit stability is disclosed. In the method of the present invention, the circuit is analyzed to find the frequency band in which the input impedance at a target node behaves as a negative resistance, and then find the signal path of the frequency band in the matching circuit in front of the target node and add an attenuator in the signal path. This prevents the circuit from oscillation and improves the stability of the circuit. Furthermore, the signal on the main signal path will not be attenuated and the performance of the circuit will be maintained.

8 Claims, 6 Drawing Sheets

METHOD FOR IMPROVING CIRCUIT STABILITY

REFERENCE TO RELATED APPLICATION

This Application is based on Provisional Application Ser. No. 62/164,840, filed 21 May 2015.

FIELD OF THE INVENTION

The present invention is related to a method for improving circuit stability, more particularly to a method for improving circuit stability of a radio frequency power amplifier circuit.

BACKGROUND OF THE INVENTION

For improving output power and reducing signal distortion, a power amplifier circuit is usually embodied as a multi-stage amplifier. For example, a plurality of amplifier circuits are connected in series for amplifying the voltage, current and power of the signal respectively.

Referring to FIG. 1, there is shown schematic diagram of a portion of a power amplifier circuit in accordance with the prior art. In a radio frequency power amplifier circuit, a matching circuit 14 is disposed between the amplifier circuits 12 and 16 for impedance matching and improving the power transmission and frequency response of a signal.

Since there are active elements in the amplifier circuits 12 and 16, the impedances of the amplifier circuits 12 and 16 may behave as a negative resistance under some conditions. When the input impedance of the amplifier circuit 16 at the node 15 behaves as a negative resistance and the output impedance of the amplifier circuit 12 at the node 15 conforms to certain conditions, the amplifier circuits 12 and 16 interact with each other and resonate. This causes the circuit to oscillate and degrades the stability of the circuit.

For preventing the circuit from oscillation, people usually connect a resistance in series between the amplifier circuit 16 and the node 15 to compensate the negative resistance at the node 15. Till the input impedance at the node 15 toward the amplifier circuit 16 does not behave as a negative resistance, the circuit would not oscillate and can keep stable.

Although the aforementioned method prevents the circuit from oscillation, the resistance on the signal path attenuates the signal and reduces the efficiency of the circuit.

Consequently, how to prevent the circuit from oscillation without reducing the efficiency of the circuit is the problem of the community.

SUMMARY OF THE PRESENT INVENTION

It is an objective of the present invention to provide a method for improving circuit stability, more particularly a method for improving circuit stability of a radio frequency power amplifier circuit.

It is another objective of the present invention to provide a method for improving circuit stability, which determines the target frequency band in which the input impedance at the target node behaves as a negative resistance and disposes an attenuator in the signal path of the frequency band in the matching circuit for preventing the circuit from oscillation.

It is still another objective of the present invention to provide a method for improving circuit stability; if the main frequency band in which the amplifier circuit is applied is different from the target frequency band, an attenuator is disposed in the target signal path of the matching circuit for preventing the circuit from oscillation without decreasing the efficiency of the circuit.

The present invention provides a method for improving circuit stability, adapted for a radio frequency power amplifier circuit, wherein the radio frequency power amplifier comprises a plurality of amplifier circuits and at least one matching circuit, wherein the method comprises steps of: choosing a target node, wherein the target node is located between one of the matching circuit and the amplifier circuit next thereto; finding a target frequency band in which an input impedance toward the amplifier circuit at the target node behaves as a negative resistance; finding a target signal path of the target frequency band in the matching circuit in front of the target node; and adding an attenuator in the target signal path.

In one embodiment of the present invention, the method further comprises a step of finding a main frequency band in which the radio frequency power amplifier circuit is applied.

In one embodiment of the present invention, if the target frequency band is different from the main frequency band, add an attenuator in the target signal path.

In one embodiment of the present invention, the method further comprises a step of finding a main signal path of the main frequency band in the matching circuit in front of the target node.

In one embodiment of the present invention, if the main signal path is different from the target signal path, add an attenuator in the target signal path.

In one embodiment of the present invention, the matching circuit is selectively connected in front of the plurality of amplifier circuits, at the end of the plurality of amplifier circuits, or between two adjacent amplifier circuits of the plurality of amplifier circuits.

In one embodiment of the present invention, the attenuator is selectively one of a resistor, a resistor with an inductor connected in series, a resistor with an inductor connected in parallel, a resistor with a capacitor connected in series or a resistor with a capacitor connected in parallel.

In one embodiment of the present invention, the radio frequency power amplifier circuit is adapted for signals of frequency between 700 MHz and 920 MHz.

DETAILED DESCRIPTION OF THE PREFERRED EMBODIMENTS

Figure 1:
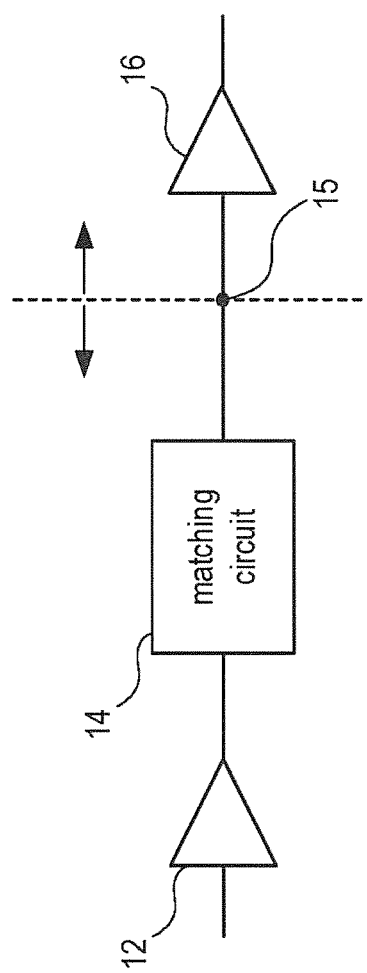
FIG. 1 is a schematic diagram showing a portion of a power amplifier circuit in accordance with the prior art.
Figure 2:
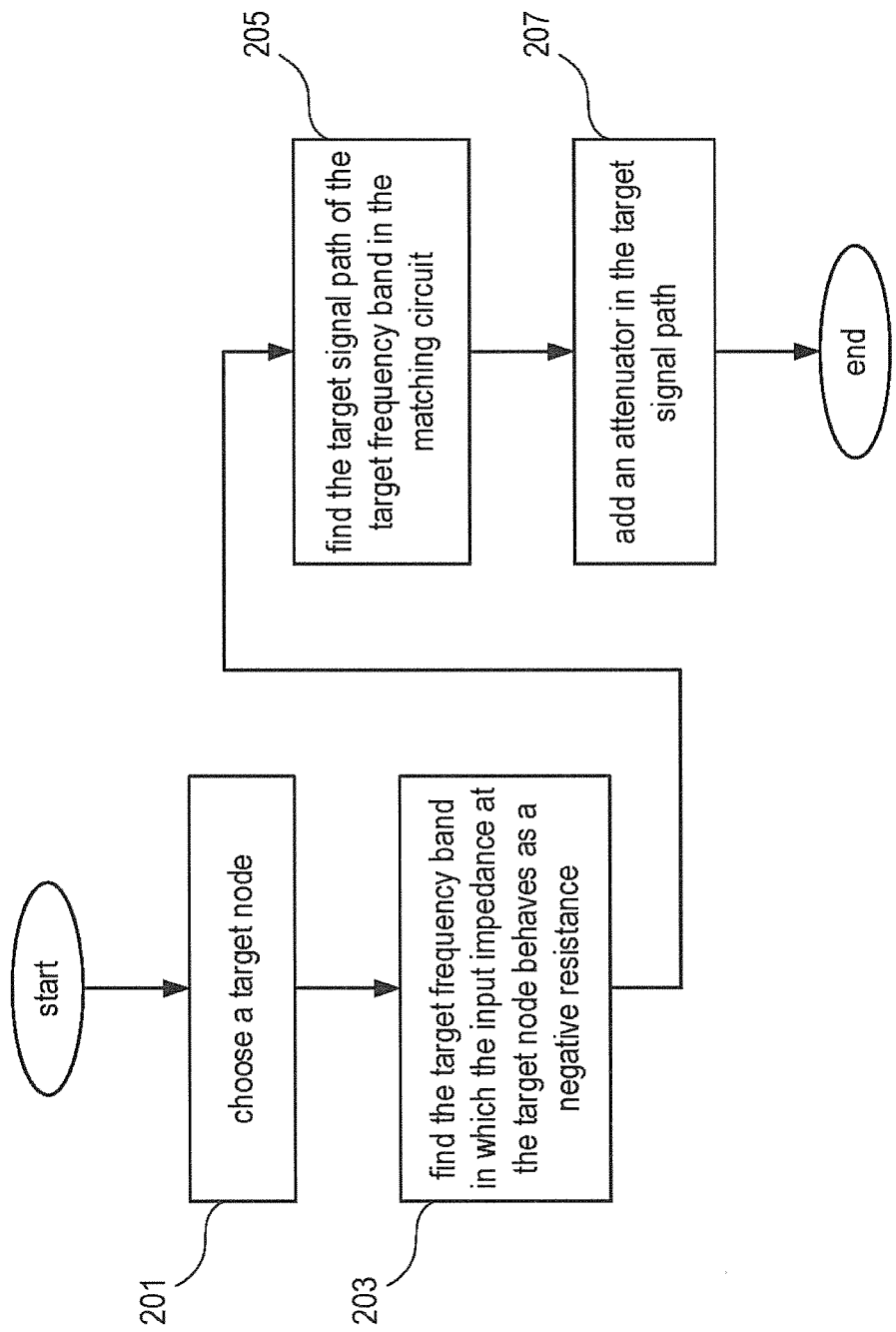
FIG. 2 is a flowchart showing the method for improving circuit stability in accordance with one embodiment of the present invention.
Figure 3:
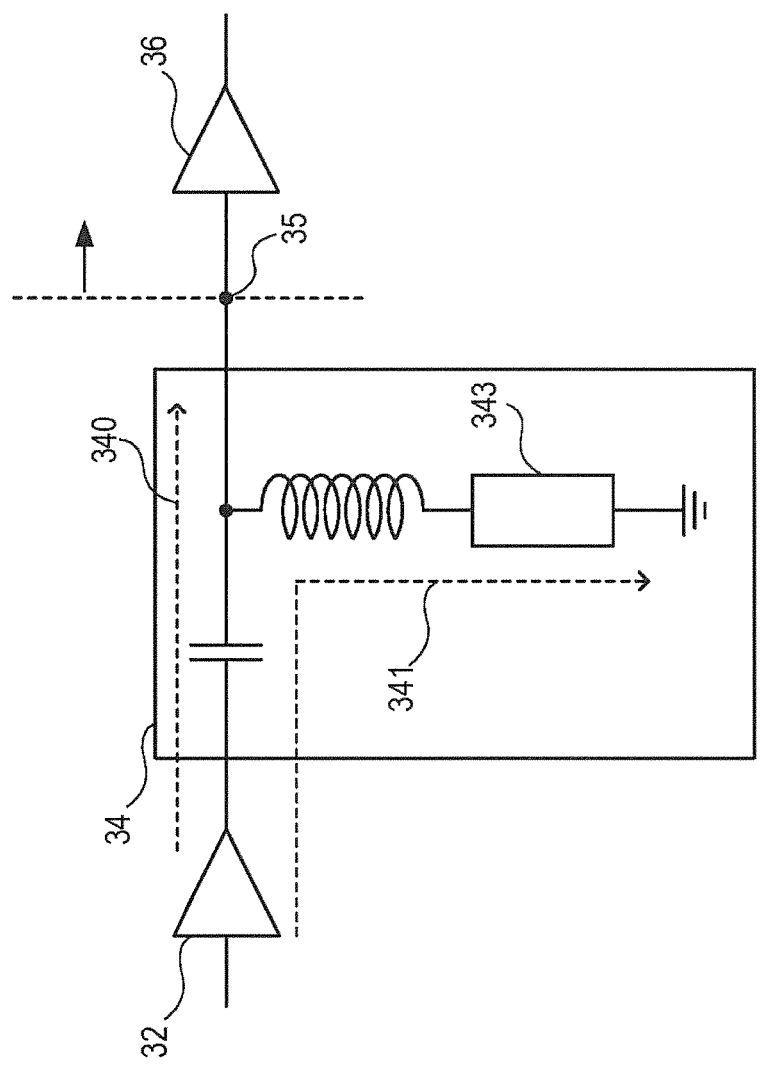
FIG. 3 is a schematic diagram showing a portion of the power amplifier circuit in accordance with one embodiment of the present invention.

Referring to FIGS. 2 and 3, there are shown a flowchart of the method for improving circuit stability and a schematic diagram of a portion of a power amplifier circuit in accordance with one embodiment of the present invention. The method of the present invention is adapted for a radio frequency power amplifier circuit. The radio frequency power amplifier circuit comprises a plurality of amplifier circuits 32 and 36 and at least one matching circuit 34. In the method of the present invention, a target node 35 is firstly chosen in the circuit. The target node 35 is located between a matching circuit 34 and the next stage of amplifier circuit 36, as shown in step 201. Then analyze the circuit to find the target frequency band in which the input impedance toward amplifier circuit 36 at the target node behaves as a negative resistance, as shown in step 203.

And then, find the target signal path 341 of the target frequency band in the matching circuit 34, as shown in step 205.

Finally, add an attenuator 343 in the target signal path 341, as shown in step 207.

In one embodiment of the present invention, the method of the present invention further comprises a step of finding the main frequency band of the radio frequency power amplifier circuit. If the main frequency band is different from the target frequency band, add an attenuator 343 in the target signal path 341.

In one embodiment of the present invention, the method of the present invention further comprises a step of finding the main signal path 340 of the main frequency band in the matching circuit 34 in front of the target node 35. If the main signal path 340 is different from the target signal path 341, add an attenuator 343 in the target signal path 341.

In one embodiment of the present invention, the attenuator 343 is selectively one of a resister, a resister with an inductor connected in series, a resister with an inductor connected in parallel, a resister with a capacitor connected in series or a resister with a capacitor connected in parallel.

In one embodiment of the present invention, the matching circuit 34 is selectively connected in front of, at the end of, or between the amplifier circuits 32 and 36.

Figure 4:
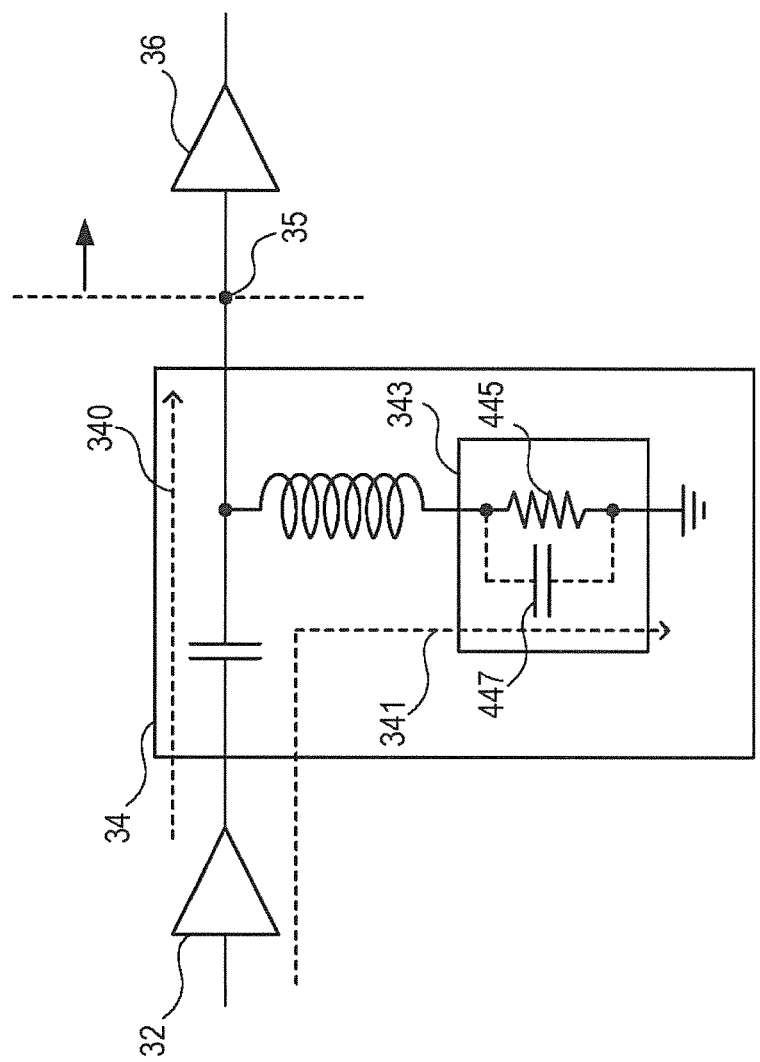
FIG. 4 is a schematic diagram showing a portion of the power amplifier circuit in accordance with another embodiment of the present invention.

Referring to FIG. 4, there is shown a schematic diagram of a portion of the power amplifier circuit in accordance with another embodiment of the present invention. In the present embodiment, the target node 35 is located between the amplifier circuit 36 and the matching circuit 34. Assume that the input impedance at the target node 35 (the impedance in the direction from the target node 35 to the amplifier circuit 36) behaves as a negative resistance in low frequency band. We analyze the matching circuit 34 and find that the signal path of low frequency band in the matching circuit 34 is the target signal path 341. And then, an attenuator 343 is connected to the target signal path 341 in series.

Since the matching circuit 34 is a high pass filter, the signal of low frequency band is transmitted by the target signal path 341. By using the method of the present invention, to add an attenuator 343 in the target signal path 341, the signal of low frequency band is attenuated. Since the resonant tank is destroyed, the circuit will not oscillate and the stability of the circuit is improved.

Furthermore, in the present embodiment, the matching circuit 34 is a high pass filter and the main frequency band is high frequency band. The input impedance at the target node 35 behaves as a negative resistance in the low frequency band, it is different from the main frequency band, and the main signal path 340 of high frequency band is different from the target signal path 341. Consequently, by using the method of the present invention to dispose an attenuator 343 in the target signal path 341 prevents the circuit form oscillating, improves the stability of the circuit without reducing the efficiency of the circuit.

In the present embodiment, the attenuator 343 is selectively one of a resistor 445 or a resistor 445 connected with a capacitor 447 in parallel for attenuating the intensity of the low frequency signal.

Figure 5:
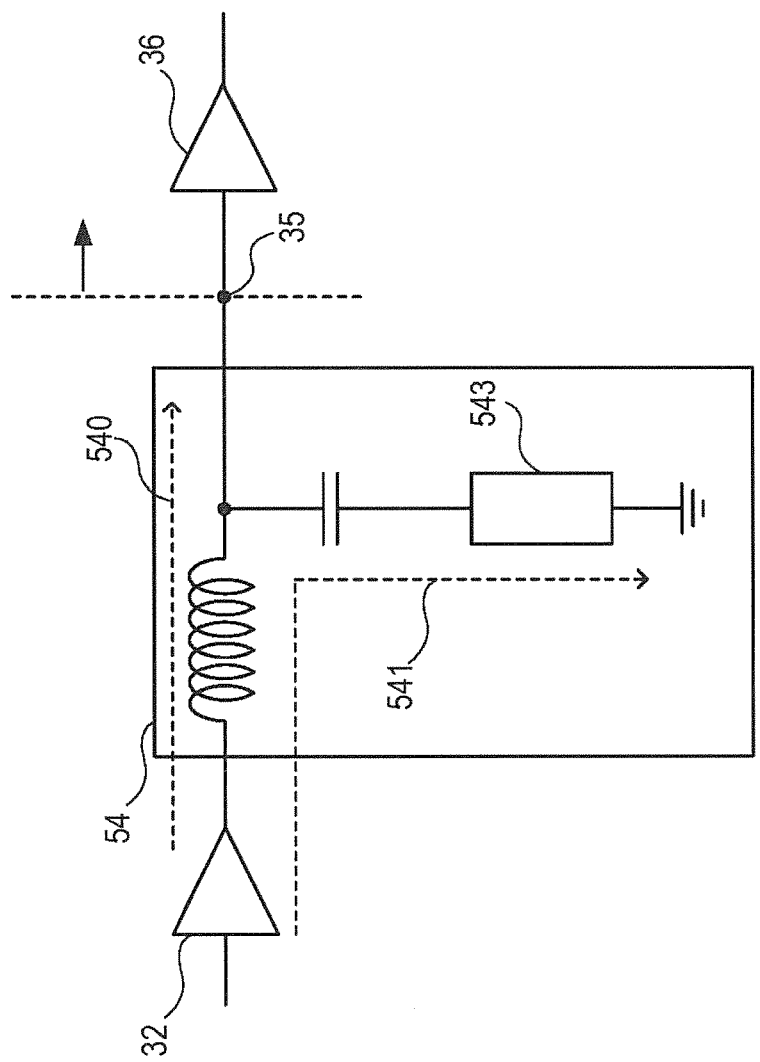
FIG. 5 is a schematic diagram showing a portion of the power amplifier circuit in accordance with still another embodiment of the present invention.

Referring to FIG. 5, there is shown a schematic diagram of a portion of the power amplifier circuit in accordance with still another embodiment of the present invention. In the present embodiment, the target node 35 is located between the amplifier circuit 36 and the matching circuit 54. Assume that the input impedance at the target node 35 behaves as a negative resistance in high frequency band. We analyze the matching circuit 54 and find that the signal path of high frequency band in the matching circuit 54 is the target signal path 541. And then, an attenuator 543 is connected to the target signal path 541 in series.

Since the matching circuit 54 is a low pass filter, the signal of high frequency band is transmitted by the target signal path 541. By using the method of the present invention, to add an attenuator 543 in the target signal path 541, the signal of high frequency band is attenuated. Since the resonant tank is destroyed, the circuit will not oscillate and the stability of the circuit is improved.

Furthermore, in the present embodiment, the matching circuit 54 is a low pass filter and the main frequency band is low frequency band. The input impedance at the target node 35 behaves as a negative resistance in the high frequency band, it is different from the main frequency band, and the main signal path 540 of low frequency band is different from the target signal path 541. Consequently, by using the method of the present invention to dispose an attenuator 543 in the target signal path 541 prevents the circuit form oscillating, improves the stability of the circuit without reducing the efficiency of the circuit.

Figure 6:
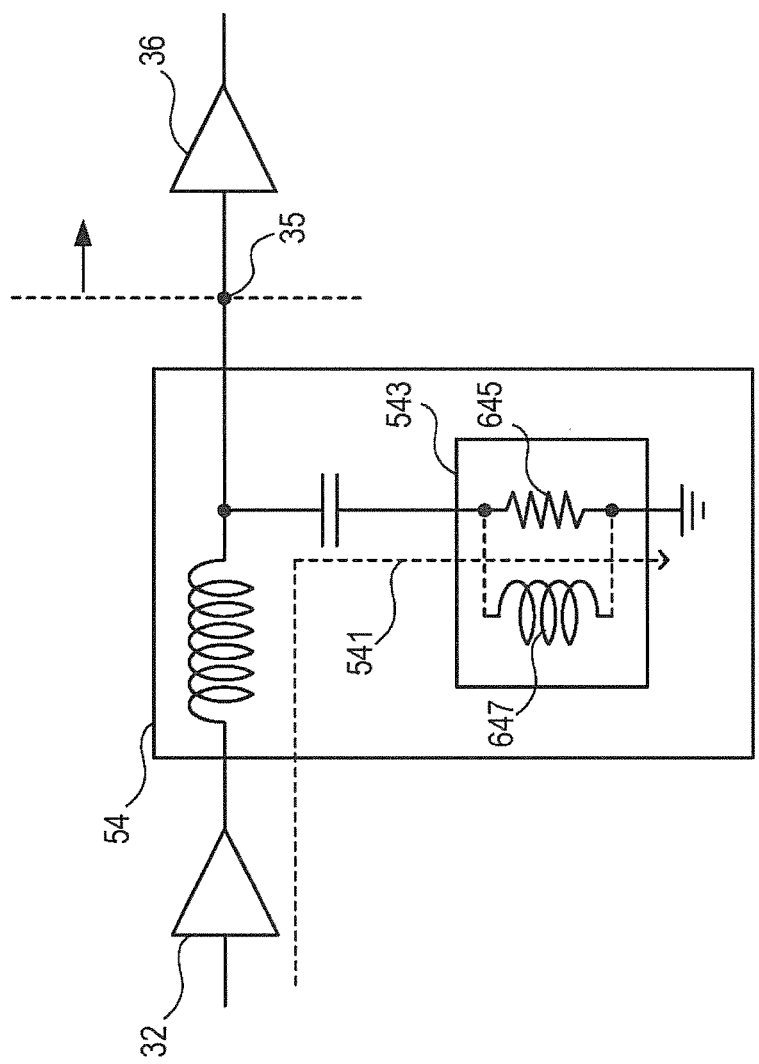
FIG. 6 is a schematic diagram showing a portion of the power amplifier circuit in accordance with still another embodiment of the present invention.

Referring to FIG. 6, there is shown a schematic diagram of a portion of the power amplifier circuit in accordance with still another embodiment of the present invention. As shown in the figure, the circuit of the present embodiment is substantially the same as the embodiment shown in FIG. 5, wherein the attenuator 543 is selectively one of a resistor 645 or a resistor 645 connected with an inductor 647 in parallel for attenuating the intensity of the signal of high frequency band.

In one embodiment of the present invention (please refer to FIG. 3 or FIG. 4), the matching circuit 34 is configured to pass signals with frequency higher than 0.6 GHz. The main frequency band is high frequency band. Assume that the input impedance at the target node 35 behaves as a negative resistance in the frequency band lower than 0.6 GHz. In other words, the target frequency band is low frequency band. For instance, the target frequency band is subharmonic of the main frequency band. By using the method of the present invention to add an attenuator 343 in the target signal path 341, the stability of the circuit is improved without reducing the efficiency of the circuit.

In one embodiment of the present invention (please refer to FIG. 5 or FIG. 6), the matching circuit 54 is configured to pass signals with frequency band between 700 MHz and 920 MHz. The main frequency band is low frequency band. Assume that the input impedance at the target node 35 behaves as a negative resistance in the frequency band higher than 920 MHz. In other words, the target frequency band is high frequency band. By using the method of the present invention to add an attenuator 543 in the target signal path 541, the stability of the circuit is improved without reducing the efficiency of the circuit.

Although particular embodiments of the invention have been described in detail for purposes of illustration, various modifications and enhancements may be made without departing from the scope of the invention specified by the claims.

What is claimed is:

1. A method for improving circuit stability, adapted for a radio frequency power amplifier circuit having a plurality of amplifier circuits and at least one matching circuit, wherein the method comprises:
choosing a target node, wherein the target node is located between one of the matching circuit and the amplifier circuit next thereto;
finding a target frequency band within which an input impedance toward the amplifier circuit at the target node behaves as a negative resistance;
finding a target signal path of for a target signal within the target frequency band in the matching circuit upstream of the target node; and
adding an attenuator in the target signal path, wherein the attenuator includes at least one resistor for resistive attenuation of the target signal passed therethrough.

2. The method as claimed in claim 1, further comprising finding a main frequency band in which the radio frequency power amplifier circuit is applied.

3. The method as claimed in claim 2, wherein if the target frequency band is different from the main frequency band, an attenuator is disposed in the target signal path.

4. The method as claimed in claim 2, further comprising finding a main signal path of the main frequency band in the matching circuit upstream of the target node.

5. The method as claimed in claim 4, wherein if the main signal path is different from the target signal path, an attenuator is disposed in the target signal path.

6. The method as claimed in claim 1, wherein the matching circuit is selectively connected upstream of the plurality of amplifier circuits, at the end of the plurality of amplifier circuits, or between two adjacent amplifier circuits of the plurality of amplifier circuits.

7. The method as claimed in claim 1, wherein the attenuator is selectively one of a resistor, a resistor with an inductor connected in series, a resistor with an inductor connected in parallel, a resistor with a capacitor connected in series or a resistor with a capacitor connected in parallel.

8. The method as claimed in claim 1, wherein the radio frequency power amplifier circuit is adapted for signals of frequency between 700 MHz and 920 MHz.

* * * * *